United States Patent [19]
Pulyer

[11] Patent Number: 5,378,988
[45] Date of Patent: Jan. 3, 1995

[54] MRI SYSTEM HAVING HIGH FIELD STRENGTH OPEN ACCESS MAGNET

[76] Inventor: Yuly M. Pulyer, 350 Revere Beach Blvd., Revere, Mass. 02151

[21] Appl. No.: 7,765

[22] Filed: Jan. 22, 1993

[51] Int. Cl.[6] .............................................. G01R 33/38
[52] U.S. Cl. ..................................... 324/318; 324/319; 335/299
[58] Field of Search ............... 324/318, 319, 320, 322; 335/297, 299; 336/225, 228

[56] References Cited

U.S. PATENT DOCUMENTS

| | | | |
|---|---|---|---|
| 2,847,607 | 8/1958 | Pierce | 315/3.5 |
| 3,214,086 | 10/1965 | Matricon | 230/69 |
| 3,238,484 | 3/1966 | Dacey | 336/228 |
| 3,450,930 | 6/1969 | Lien | 315/3.5 |
| 3,781,592 | 12/1973 | Harrold | 315/39.71 |
| 3,896,329 | 7/1975 | Lien | 315/3.5 |
| 3,930,212 | 12/1975 | Ioffe et al. | 335/284 |
| 4,003,336 | 1/1977 | Koester et al. | 118/640 |
| 4,177,442 | 12/1979 | Bate et al. | 335/284 |
| 4,207,494 | 6/1980 | Hatakenaka et al. | 315/5.35 |
| 4,267,541 | 5/1981 | Narikiyo | 335/212 |
| 4,339,718 | 7/1982 | Bull | 324/320 |
| 4,382,244 | 5/1983 | Koester et al. | 335/284 |
| 4,399,389 | 8/1983 | Fleury et al. | 315/3.5 |
| 4,399,422 | 8/1983 | Nelson et al. | 335/284 |
| 4,440,106 | 4/1984 | Greiner et al. | 118/640 |
| 4,553,122 | 11/1985 | Young | 335/297 |
| 4,641,119 | 2/1987 | Moore | 324/319 |
| 4,656,449 | 4/1987 | Mallard et al. | 335/229 |
| 4,682,137 | 7/1987 | Kasza et al. | 335/284 |
| 4,701,736 | 10/1987 | McDougall et al. | 335/299 |
| 4,761,584 | 8/1988 | Halbach | 315/4 |
| 4,933,596 | 6/1990 | Yoshii et al. | 313/440 |

FOREIGN PATENT DOCUMENTS

| | | | |
|---|---|---|---|
| 1158183 | 11/1963 | Germany . | |
| PCT/GB89/-01296 | 10/1989 | United Kingdom | G01R 33/20 |
| 2244134 | 11/1991 | United Kingdom | 324/319 |

OTHER PUBLICATIONS

Pissanetzky, IEEE Transactions On Magnetics, vol. 28, No. 4 (Jul. 1992).
Pissanetzky, 5th IEEE Conference on Electromagnetic Field Computation Aug. 3–5, 1992.
Houston Advanced Research Center (HARC)—MRI Magnetic With Unprecedented Patient Access.

*Primary Examiner*—Kenneth A. Wieder
*Assistant Examiner*—Raymond Y. Mah
*Attorney, Agent, or Firm*—George W. Neuner

[57] ABSTRACT

An MRI system has a magnet configuration that provides access for a surgeon or other personnel to perform procedures on a patient under support of real time MRI image. The magnet system uses a plurality of C-shape solenoidal magnets oriented to form an imaging volume in a central region of the magnets so that the magnetic flux from each magnet contributes to the magnetic field in the imaging volume. The configuration provides a high strength field in the imaging volume. The MRI system has a gradient coil for providing a magnetic field gradient in the imaging volume and an Rf coil for providing an Rf signal in the imaging volume. Preferably, the Rf coil also receives NMR signals from a specimen in the imaging volume.

12 Claims, 4 Drawing Sheets

MRI SYSTEM HAVING HIGH FIELD STRENGTH OPEN ACCESS MAGNET

FIELD OF THE INVENTION

This invention relates to a magnet design particularly useful for Magnetic Resonance Imaging ("MRI") and, more specifically, it pertains to a magnet configuration having two (or more) electromagnet C-solenoidal coil pairs generating substantially similar and symmetrical magnetic fluxes that superpose in the mutually central region of the magnet structure coupling with each solenoidal coil.

BACKGROUND OF THE INVENTION

There are known whole body and partial body MRI systems (e.g., superconductive, resistive having cylindrical symmetry, and iron core magnets having permanent magnet and electromagnet excitation) having an imaging area in the central part of the magnet. The imaging area or region in the central part of these known magnets is generally not accessible for medical personal when a patient is placed in the magnet for MRI. In addition, the geometry of those type of prior art designs of superconductive magnets are typically limited in terms of field strength at about 1.5-2 T, which is sufficient for obtaining images of most body tissue and for spectroscopy. However, a higher field strength up to 3-5 T, and even higher, is required to image using phosphor NMR signals of tissue or to provide more precise spectroscopy. Whole Body magnets providing such high field strength are technically difficult to achieve with the present state of the art of solenoidal superconductive magnets.

An iron core magnet described by Pulyer in U.S. Pat. No. 5,049,848, which may be particularly useful for MRI mammography, has magnet geometry that may conceptually provide access to part of body placed into the imaging space, i.e. air gap or imaging volume. However, iron core magnets of that type are limited in field strength due to iron core saturation limits.

Accordingly, new magnet designs are desired that provide high field strength and that provide access for medical personnel, particularly for whole body imaging.

SUMMARY OF THE INVENTION

In accord with the present invention, an MRI system is provided having a magnet structural configuration with the capability of providing high field strength in the imaging volume and having access for medical personnel to conduct procedures while the patient is positioned in the imaging volume. The magnet system of the present invention comprises a plurality of C-shape solenoidal magnets adapted and arranged or oriented around a central longitudinal axis to form an imaging volume in a central region of the magnets along said central axis so that the magnetic flux from each magnet is superposed with the flux from the other magnet or magnets and contributes to the magnetic field in the imaging volume. The configuration provides a high strength field in the imaging volume. The magnet system further comprises a gradient coil for providing a magnetic field gradient in the imaging volume and an Rf coil for providing an Rf signal in the imaging volume. Preferably, the Rf coil also receives NMR signals from a specimen in the imaging volume.

In one preferred embodiment of the invention, a magnet system comprises two pair of C-shape solenoidal magnets oriented to form an imaging volume in a central region of the magnets so that the magnetic flux from each magnet contributes to the magnetic field in the imaging volume. Each pair of magnets comprises two diametrically opposed magnets, i.e. the N-pole of one magnet facing the N-pole of the other magnet so that the flux from each of the magnets flows in the same direction through the imaging volume. This configuration advantageously creates a substantially homogeneous high strength field in the imaging volume. Gradient and Rf coils are provided to obtain imaging data.

In another preferred embodiment, two conical shape electromagnets are provided on the central axis of the C-shape solenoidal magnets, one adjacent and in the center of the N-poles and one adjacent and in the center of the S-poles. The conical shape coils support and shim the magnetic field generated by the primary C-shape solenoidal magnets.

In preferred magnetic systems in accord with the present invention, a mutual magnetic coupling geometry is configured to minimize leakage flux and to maximize flux coupling for producing maximal field contribution to the central imaging area by appropriate coil configuration and connection. Thus, preferred magnet systems have an efficient specific flux superposition capability along with a kind of mutual flux in the central imaging space. Advantageously, access into the imaging area is possible due to angular separation between two adjacent solenoidal magnets. For example, in a magnet system of the invention comprising two pair of solenoidal magnets orthogonal to each other, access could be provided for doctor entrance along one direction between two adjacent solenoidal magnets and patient access could be provided along a direction orthogonal to the first.

Magnet systems of this invention can provide a method and apparatus for obtaining accessibility for medical personal into the imaging space to perform medical procedures, while monitoring with real time imaging, due to the magnet geometry and magnetic circuit topology, which provide the technical capability to substantially increase magnetic field strength due to flux superposition in the imaging area in an economical and efficient way.

BRIEF DESCRIPTION OF THE DRAWING

FIG. 1b is a plan view, partially in cross-section, along 1b-1b in FIG. 1a.

FIG. 2a is an approximate planar equivalent magnetic circuit of the magnet system of FIG. 1a.

FIG. 2b is a simplified equivalent magnetic circuit corresponding to the circuit of FIG. 2a.

DETAILED DESCRIPTION OF THE INVENTION

Figure 1A:
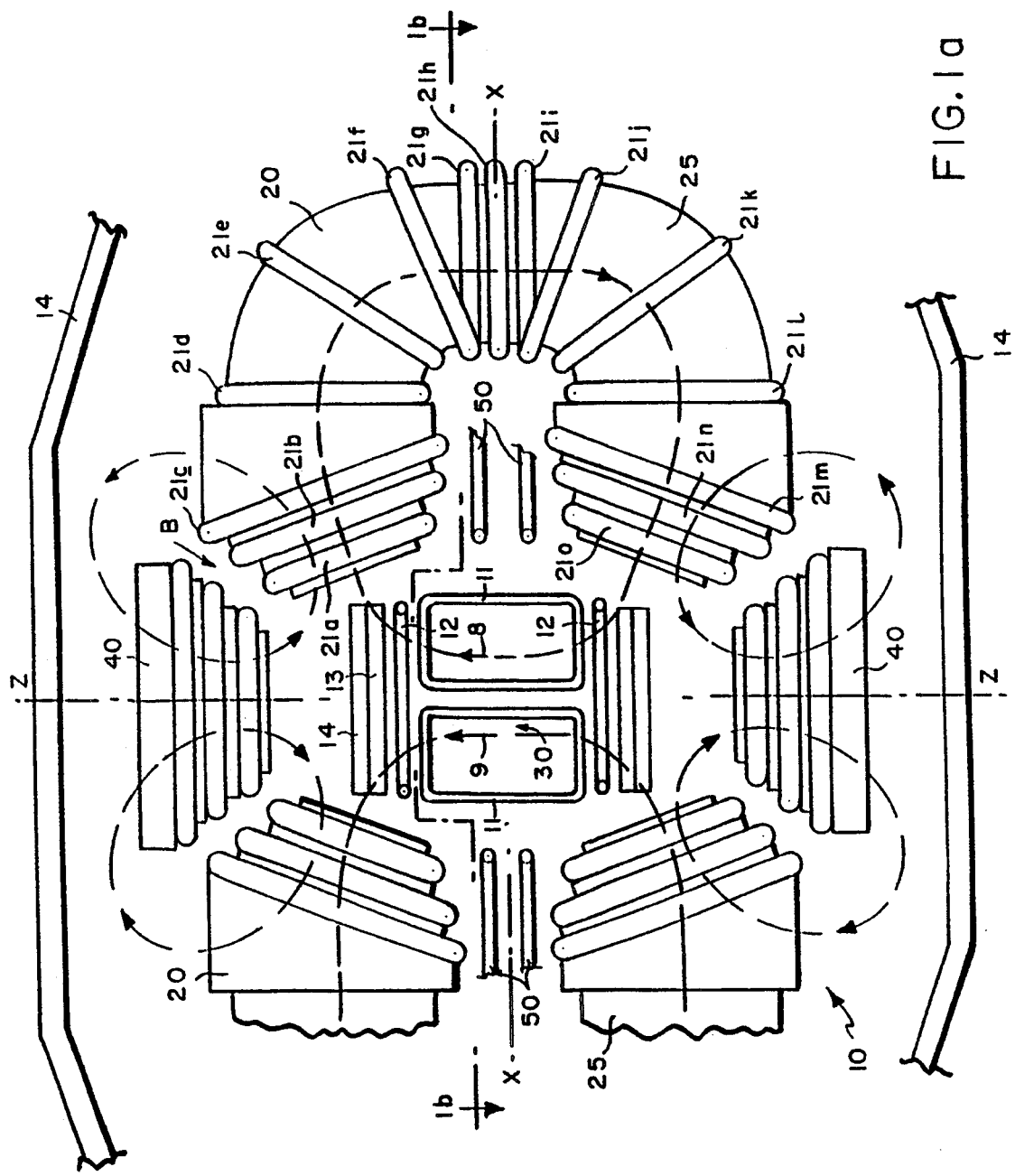
FIG. 1a is a front elevation view, partially in cross-section, of one embodiment of a magnet system in accord with the present invention.
Figure 1B:
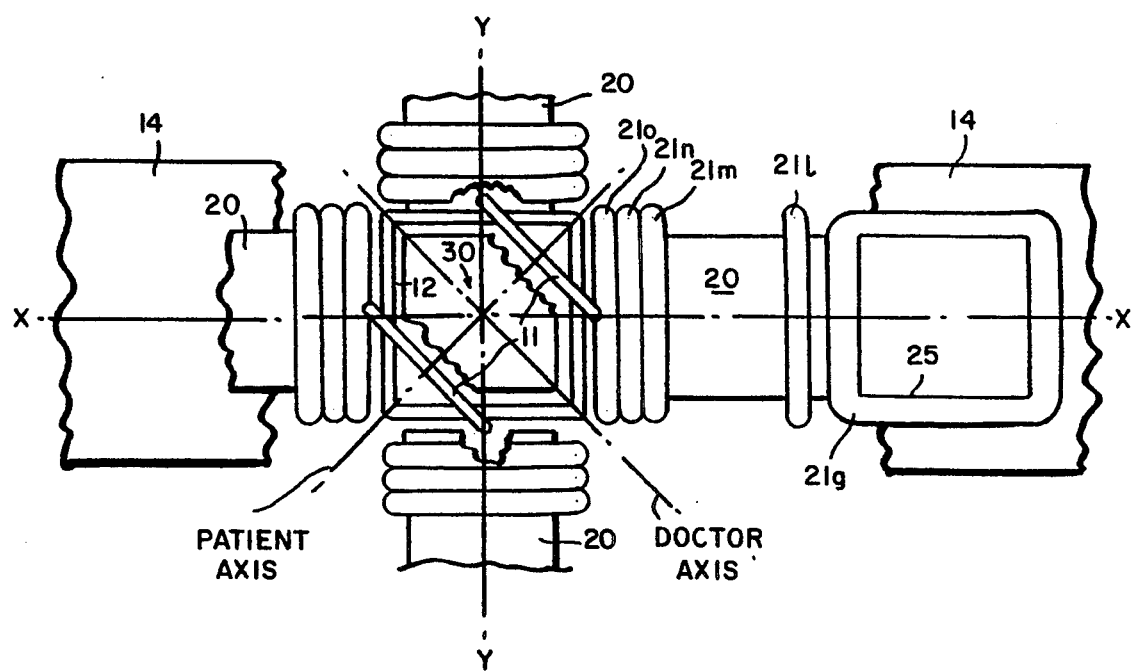

Referring to the drawings, FIG. 1a illustrates a view in the ZX plane of one embodiment of an MRI system 10 in which the present invention is employed. The illustrated MRI system 10 has two pair of symmetrical C-shaped basic solenoid magnets 20, each pair of magnets facing each other, the one pair being positioned orthogonal to the other (FIG. 1b). Each solenoid consists of a tubular structure 25 typically made of a non-ferromagnetic material and shaped generally like the letter "C". Around each tubular structure are a plurality of electric coils 21 "a" through 21 "o". The electric coils 21 provide a magnetic field and a flux through the tubular structure 25 and through the central air gap or imaging volume 30. Each of the solenoids 20 are configured and arranged so that the flux from each is equal and in the same direction in the air gap/imaging volume 30. The superposition of the flux from each of the solenoids in the imaging volume provides a high strength magnetic field.

Advantageously, the electric coils are made of superconductive material. The symmetrical arrangement of the solenoids provides conditions for obtaining a substantially homogeneous field in the imaging volume. Shimming coils can be used to modify or increase the homogeneity of the field in the imaging volume.

The tubular structure supporting the electric coils of the solenoids can have any convenient cross-sectional shape. The shape illustrated in the drawings is square, however a circular cross-section or other geometric shapes can be used.

The C-shaped tubular structures 20 are preferably configured to provide a conical like stepped narrowing toward the open ends to provide: (1) a parallel orientation of the wire coils near the open ends of a solenoidal magnet 20 with the coils at the opposite end of the solenoid (A, FIG. 1a) and with the adjacent central axis conical like coil 40 (B, FIG. 1a); (2) optional optimal orientation of the excitation ampere turns boundary to create highest field strength due to flux superposition in a given imaging area at highest homogeneity; and (3) a high efficiency magnet by minimization leakage flux due to concealing field in the internal area A of the C-solenoidal electromagnet 20.

Advantageously, conical like stepped solenoidal magnets 40 are provided on the longitudinal center axis Z. Electrical coils are provided on the stepped magnets 40 to support and shim the central flux obtained from basic C-shape solenoidal magnets 20.

A plurality of excitation ampere turns (coils), e.g. 21a, 21b, ... 21o, etc., are provided on each solenoidal magnet 20 to create active boundary conditions for delivering a kind of toroidal shaped flux having contour lines as illustrated conceptually by dashed lines 8, 9 in FIG. 1a.

Coil sets 50 are preferably provided in the center of the C-shape solenoid to shim the central flux contributed from the basic C-solenoidal magnet 20.

Referring to FIG. 1b, two orthogonal entrance axes into the imaging area are illustrated: one patient axis and the other axis for doctors (or other medical personnel). Also shown is a placement of Rf coils 11 and a Z gradient Helmholz coil pair 12. The XY gradient coils are conveniently provided in a flat (planar) form 13, 14.

The MRI system of the present invention is operated in a conventional manner well known to those skilled in the art to obtain imaging data. Images are reconstructed from the data by well known techniques.

Figure 2A:
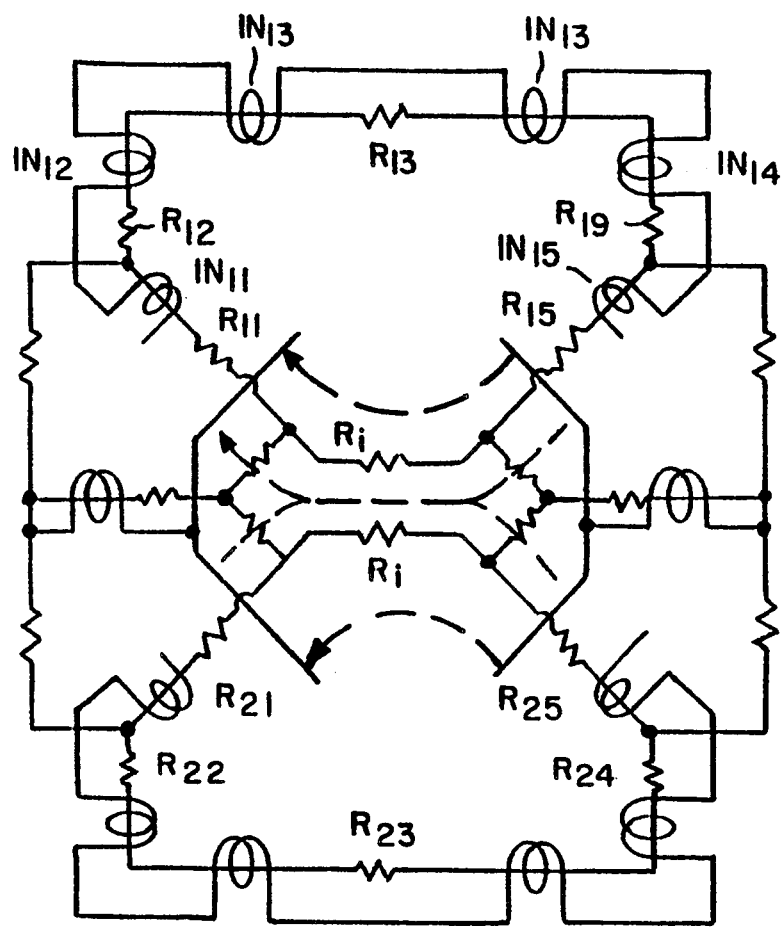
Figure 2B:
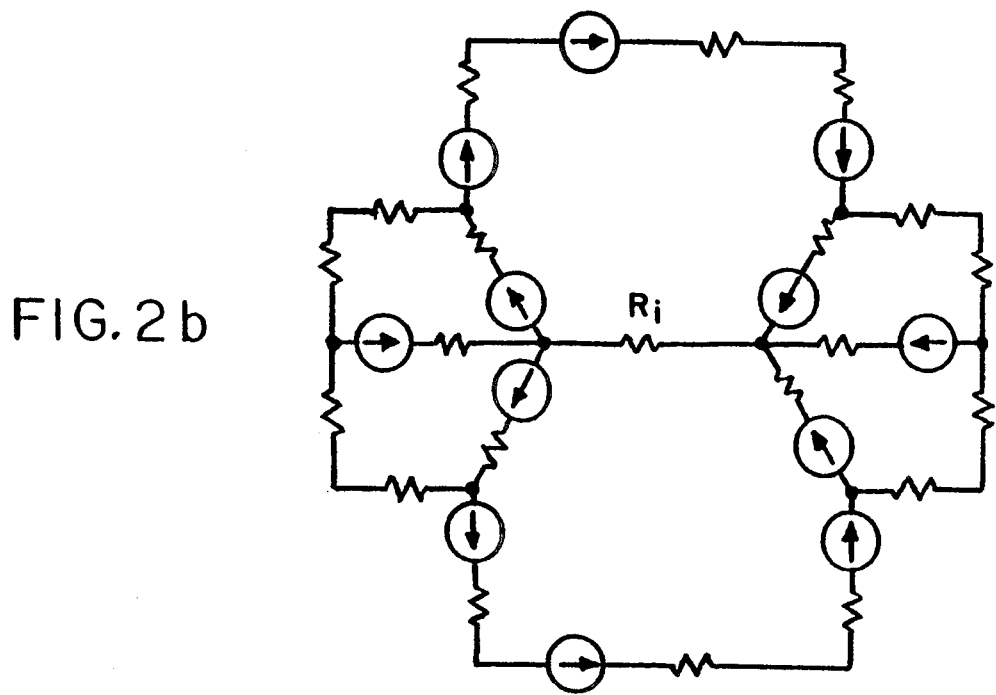

To illustrate the effect of flux superposition, one can use lumped parameters equivalent circuits as shown in FIGS. 2a, 2b, 2c, and 2d. In the equivalent circuit of FIG. 2a are shown all basic parts of air reluctance of the C-solenoidal coil in which magnetic circuits are represented by reluctance $R_{11}=R_{15}$, $R_{12}=R_{14}$, and major air reluctance $R_{13}$ for the solenoid. Solenoidal coil mmf or coil ampere turns are shown in conventional symbolic mode as $F_{11}=IN_{11}$ etc. Equivalent circuit FIG. 2b is a simplification of the circuit in FIG. 2a depicting a mutual reluctance $R_i$ in the flux superposition imaging area and substituting mmf by symbols of H-field sources.

Figure 2C:
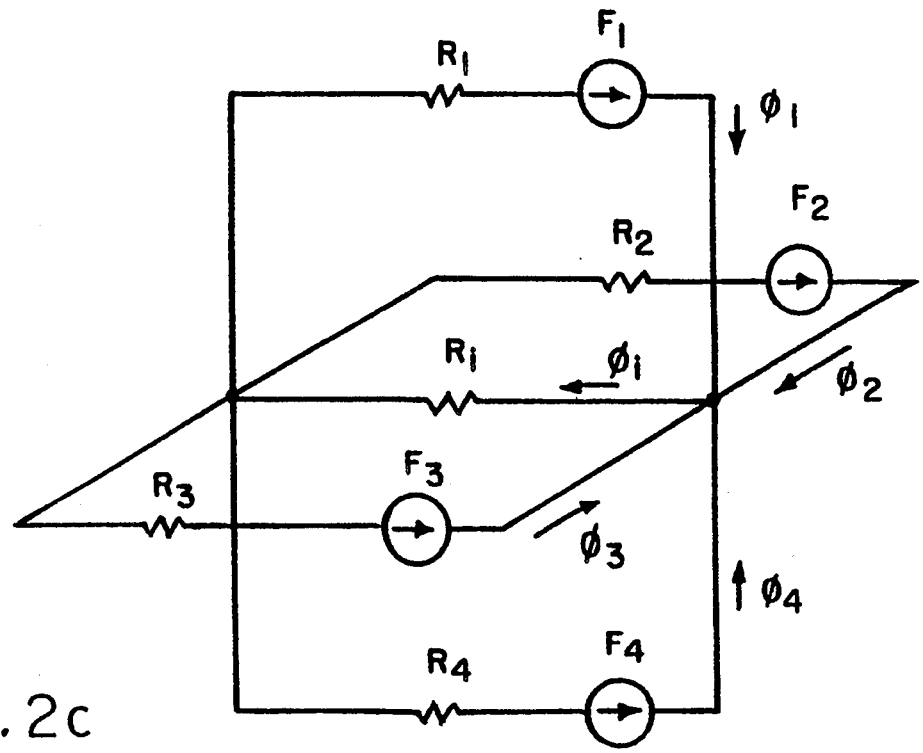
FIG. 2c is a further equivalent circuit simplication presented in three dimensional form corresponding to the magnet system of FIG. 1a and circuit of FIG. 2b.
Figure 2D:
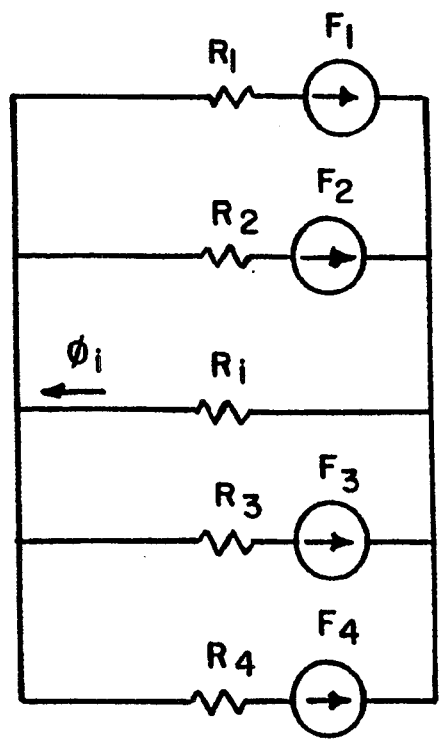
FIG. 2d is a planar illustration of the circuit of FIG. 2c for easier and instructive analytical description and brief analysis.

FIG. 2c shows a further equivalent circuit simplification and presentation in three dimensional mode, and FIG. 2d is a further simplification of the three dimensional circuit to present it in planar mode, for which the following equation can be written. According to Kirchhoff's first law:

$$\Phi_i = 4\Phi_s \tag{1}$$

wherein $\Phi_i$ is the flux in the imaging area in the central air gap and $\Phi_s$ is the flux in each solenoid. $\Phi_s=\Phi_1=\Phi_2=\Phi_3=\Phi_4$. Considering the circuit to be symmetric and, hence, all reluctance are equal, the following equation can be written regarding any loop or contour involving central air gap reluctance $R_i$, C-solenoid total equivalent reluctance $R_s$ (i.e. the reluctance for an average path of flux for a toroidal path formed by the C-shape solenoid; and $R_s=R_1=R_2=R_3=R_4$) and total C-solenoidal magnetomotive force $F_s$ (where $F_s=F_1=F_2=F_3=F_4$):

$$\Phi_i = \frac{F_s - \Phi_s R_s}{R_i} \tag{2}$$

Solution of the two equations yields:

$$\Phi_i = \frac{F_s}{R_i + \frac{R_s}{4}} \tag{3}$$

The $B_z$ field in the central air gap imaging area can be approximately represented as:

$$B_z = \frac{\Phi_i}{A_g} \tag{4}$$

where $A_g$ is the central air gap cross-sectional area (in the XY plane). According to equation (3), it can be seen that the flux in central imaging area can be increased due to substantial decreasing of influence of the C-solenoidal equivalent reluctance $R_s$ when a plurality of solenoids are used in a flux superposition configuration as illustrated.

Thus, for the particular magnetic system configuration illustrated, the superposition flux in the imaging area can be further increased by a substantial reduction of the C-solenoid equivalent air reluctance, which according to the equations has the most substantial effect.

Taking as an example that $R_s=3R_i$, it can be seen according to equation 3 that flux in the superposition imaging area represented as:

$$\Phi_i = \frac{F}{R_i + 3\frac{R_i}{4}}$$

Calculating the ratio between flux generating by only one C-solenoidal coil and by four coils, the gain or flux increase in the imaging are:

$$K = \frac{R_i + R_s}{R_i + \frac{R_s}{4}} = \frac{1 + \frac{R_s}{R_i}}{1 + \frac{R_s}{4R_i}} = \frac{1+3}{1+3/4} = \frac{16}{7} = 2.3$$

Electromagnetic field excitation systems useful in the practice of this invention can be made from superconductive or resistive coil systems. According to FIG. 1a, it can be seen that electromagnets in accord with a preferred embodiment of the invention are configured to obtain a placement of mutually orthogonal planar XYZ gradient coils, the solenoidal dc field excitation coils and also planar Rf coils to generate appropriate fields. Such a magnet configuration in accord with preferred embodiments of the present invention can provide substantial field strength and homogeneity in the imaging volume and close to cylindrical symmetry.

The invention has been described in detail, including the preferred embodiments thereof. However, it will be appreciated that those skilled in the art, upon considering the specification including the drawings, may make modifications and improvements within the spirit and scope of the invention.

I claim:

1. An MRI system comprising a magnet system configuration, said magnet system comprising a plurality of C-shape solenoidal magnets arranged around a central longitudinal axis to form an imaging volume in a central region of the magnets along said central axis so that the magnetic flux from each C-shape solenoidal magnet is superposed with the flux from the other C-shape solenoidal magnets and contributes to the magnetic field in the imaging volume, each C-shape solenoidal magnet comprising a tubular structure of a non-ferromagnetic material configured in a C-shape, one end of the C-shape tubular structure providing the N-pole and the other end providing the S-pole, the tubular structure having a plurality of electrical coils wound around the circumference of the tubular structure to provide a toroidal shape magnetic flux through the air space defined by the tubular structure and the imaging volume, the MRI system further comprising a gradient coil for providing a magnetic field gradient in the imaging volume and an Rf coil for providing an Rf signal in the imaging volume.

2. The MRI system of claim 1, wherein the Rf coil also receives NMR signals from a specimen in the imaging volume.

3. The MRI system of claim 1, wherein the magnet system further comprises two conically shaped electromagnets on the central axis of the C-shape solenoidal magnets, one adjacent and in the center of the N-poles of the C-shape solenoidal magnets and the second adjacent and in the center of the S-poles of the C-shape solenoidal magnets.

4. The MRI system of claim 1, wherein the magnet system further comprises an angular space between two adjacent C-shape solenoidal magnets, the space providing access to the imaging volume.

5. The MRI system of claim 4, wherein access is provided for a patient along one direction and access is provided along another direction for conducting a medical procedure on the patient.

6. The MRI system of claim 5, wherein the two directions are along orthogonal axes.

7. An MRI system comprising a magnet system configuration, said magnet system comprising two pair of C-shape solenoidal magnets arranged around a central longitudinal axis to form an imaging volume in a central region of the C-shape solenoidal magnets along said central axis so that the magnetic flux from each C-shape solenoidal magnet is superposed with the flux from the other C-shape solenoidal magnets and contributes to the magnetic field in the imaging volume, each C-shape solenoidal magnet comprising a tubular structure of a non-ferromagnetic material configured in a C-shape, one end of the C-shape tubular structure providing the N-pole and the other end providing the S-pole, the tubular structure having a plurality of electrical coils wound around the circumference of the tubular structure to provide a toroidal shape magnetic flux through the air space defined by the tubular structure and the imaging volume, the MRI system further comprising a gradient coil for providing a magnetic field gradient in the imaging volume and an Rf coil for providing an Rf signal in the imaging volume, wherein each pair of C-shape solenoidal magnets comprises two diametrically opposed magnets with the N-pole of the first C-shape solenoidal magnet facing the N-pole of the second C-shape solenoidal magnet so that the flux from each of the C-shape solenoidal magnets flows in the same direction through the imaging volume.

8. The MRI system of claim 7, wherein the Rf coil also receives NMR signals from a specimen in the imaging volume.

9. The MRI system of claim 7, wherein the magnet system further comprises two conically shaped electromagnets on the central axis of the C-shape solenoidal magnets, one adjacent and in the center of the N-poles of the C-shape solenoidal magnets and the second adjacent and in the center of the S-poles of the C-shape solenoidal magnets.

10. The MRI system of claim 7, wherein the magnet system further comprises an angular space between two adjacent C-shape solenoidal magnets, the space providing access to the imaging volume.

11. The MRI system of claim 10, wherein access is provided along another direction for a patient along one direction and access is provided for conducting a medical procedure on the patient.

12. The MRI system of claim 10, wherein the two directions are along orthogonal axes.

* * * * *